United States Patent [19]

Kuhara

[11] Patent Number: 5,830,142
[45] Date of Patent: Nov. 3, 1998

[54] MAGNETIC RESONANCE DIAGNOSTIC APPARATUS INCLUDING A CANCELING MAGNETIC FIELD GENERATOR

[75] Inventor: Shigehide Kuhara, Zama, Japan

[73] Assignee: Kabushiki Kaisha Toshiba, Kawasaki, Japan

[21] Appl. No.: 813,071

[22] Filed: Mar. 7, 1997

[30] Foreign Application Priority Data

Mar. 12, 1996 [JP] Japan .................................. 8-054769

[51] Int. Cl.⁶ ................................................. A61B 5/055
[52] U.S. Cl. ...................... 600/410; 324/318; 324/322; 600/422
[58] Field of Search .................................. 600/410, 421, 600/422; 324/307, 309, 318, 322

[56] References Cited

U.S. PATENT DOCUMENTS

| | | | |
|---|---|---|---|
| 4,703,275 | 10/1987 | Holland | 324/318 |
| 4,761,612 | 8/1988 | Holland et al. | 324/307 |
| 5,073,858 | 12/1991 | Mills | 364/413.13 |
| 5,488,299 | 1/1996 | Kondo et al. | 324/318 |
| 5,497,773 | 3/1996 | Kuhara et al. | |
| 5,555,251 | 9/1996 | Kinamen | 324/319 |
| 5,592,087 | 1/1997 | Richard et al. | 324/318 |
| 5,722,409 | 3/1998 | Kuhara et al. | 128/653.2 |

Primary Examiner—Marvin M. Lateef
Assistant Examiner—Eleni Mantis Mercader
Attorney, Agent, or Firm—Oblon, Spivak, McClelland, Maier & Neustadt, P.C.

[57] ABSTRACT

A magnetic resonance diagnostic apparatus sequentially generates a high-frequency magnetic field and a gradient magnetic field to generate a MR signal from a subject in a imaging space and reconstructs a MR image of the subject on the basis of the MR signal. As a result, a stimulative magnetic field that stimulates part of the subject develops so as to cross the gradient magnetic field. The stimulative magnetic field occurs in synchronization with the gradient magnetic field. A canceling magnetic field that opposes the stimulative magnetic field is generated. The canceling magnetic field has the reversed polarity to that of the stimulative magnetic field. As a result, the resultant magnetic field of the stimulative magnetic field and canceling magnetic field has a lower intensity than that of the stimulative magnetic field, so that the stimulus the subject feels becomes smaller.

19 Claims, 5 Drawing Sheets

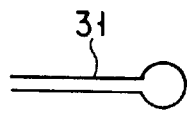
FIG. 10
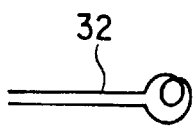
FIG. 11
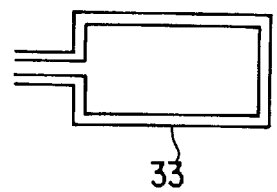
FIG. 12
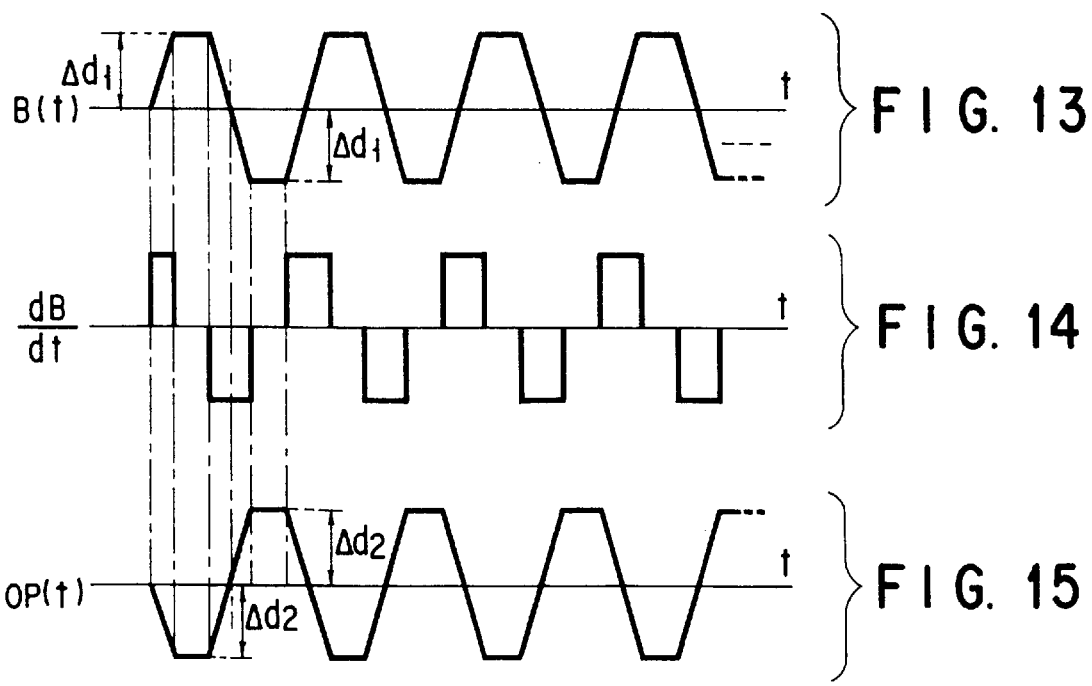
FIG. 13
FIG. 14
FIG. 15

MAGNETIC RESONANCE DIAGNOSTIC APPARATUS INCLUDING A CANCELING MAGNETIC FIELD GENERATOR

BACKGROUND OF THE INVENTION

This invention relates to a magnetic resonance diagnostic apparatus capable of acquiring in-vivo information from outside the body, making use of a magnetic resonance phenomenon.

A magnetic resonance phenomenon is the phenomenon that an atomic nucleus put in a static magnetic field (with a magnetic field intensity of H0) resonantly absorbs the energy of a high-frequency magnetic field rotating at an angular velocity determined by ω 0=γ H0 (where γ is the magnetic rotation ratio) and radiates energy after the high-frequency magnetic field has stopped.

The methods of imaging the spatial distribution of hydrogen nucleuses in water or fat making use of the magnetic resonance phenomenon include the projective reconstruction method by Lauterbur, the Fourier method by Kumar, Welti, Ernst, et al., and the spin warp method, a modification of the Fourier method, by Hutchison et al.

The most-widely used imaging method, as everyone knows, has been the 2DFT (two-dimensional Fourier transformation method) in recent years. With this type of imaging method, the positional information is obtained by causing a gradient magnetic field to control the phase and frequency of a magnetic resonance (MR) signal.

Here, it is apparent from Maxwell's equation that as shown in FIG. 1, when a current is caused to flow through a gradient coil, this causes two gradient magnetic fields 21, 22 to develop. The gradient axes of the two gradient magnetic fields 21, 22 cross at right angles in the origin with a magnetic field intensity of zero (the central point of imaging). Gradient magnetic field components 21 which is parallel with the Z-axis is useful for giving the positional information to the MR signal, but the other gradient magnetic field components 22 which is parallel with the Z-axis is useless for the same purpose. Suppose the former is just called a gradient magnetic field and the latter is called a cross gradient magnetic field.

Although the cross gradient magnetic field has been neglected until now, it cannot be neglected in high-speed imaging represented by the echo planer imaging scheme (EPI). In the EPI, high gradient magnetic fields are caused to alternate with each other. When the gradient magnetic fields slope in the direction in which they cross the axis of the subject, that is, when an X-axis gradient magnetic field or a Y-axis gradient magnetic field have been generated, the gradient axes of the respective gradient magnetic fields are parallel with the axis of the subject. As a result, at the section of the subject far away from the imaging central line(the section is the chest when the head is imaged, the section is the head or waist when the chest is imaged), the magnetic field intensity of the cross gradient magnetic fields become very high. In the period during which the strong cross gradient magnetic fields rise and fall rapidly, a very strong eddy current is induced at the waist which has the wide cross section, which causes the subject to feel a stimulus (magnetic stimulus).

In addition to the generation of the X-axis and Y-axis gradient magnetic fields, when the z-axis gradient magnetic field is generated, this type of magnetic stimulus is also generated by the gradient magnetic field itself.

To alleviate the stimulus, the section which the subject feels the magnetic stimulus have been covered with a conductive sheet. This measure, however, has disadvantages in that an eddy magnetic field produced by the eddy current induced on the sheet distorts the gradient magnetic fields spatially and temporally, therefore the image quality is deteriorated. To overcome these shortcomings, various attempts have been made to shorten the time constant by, for example, changing the materials or making slits. When the time constant is made too small, the effect of alleviating the magnetic stimulus becomes smaller.

BRIEF SUMMARY OF THE INVENTION

The object of the present invention is to provide a magnetic resonance diagnostic apparatus capable of alleviating the magnetic stimulus that the subject feels without distorting the gradient magnetic fields spatially and temporally.

The foregoing object is accomplished by providing a magnetic resonance diagnostic apparatus comprising: generator for sequentially generating a high-frequency magnetic field and a gradient magnetic field to generate a MR signal from a subject in a imaging space; processor for acquiring medical information on the subject on the basis of the MR signal; and a canceling magnetic field generator for generating, disposed outside the imaging space, a canceling magnetic field that opposes a stimulative magnetic field that stimulates part of the subject, wherein the stimulative magnetic field is generated in synchronization with the gradient magnetic field, the canceling magnetic field has the reversed polarity to that of the stimulative magnetic field, and the resultant magnetic field of the stimulative magnetic field and the canceling field has a lower intensity than that of the stimulative magnetic field.

The foregoing object is also accomplished by providing a canceling magnetic field generating apparatus comprising: a coil disposed by the side of any portion of a subject; and an amplifier for supplying a current to the coil to generate a canceling magnetic field that opposes a stimulative magnetic field that stimulates the portion, wherein the canceling magnetic field has the reversed polarity to that of the stimulative magnetic field and the resultant magnetic field of the stimulative magnetic field and the canceling magnetic field has a lower intensity than that of the stimulative magnetic field.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 10 to 12 show examples of the coil pattern of the sensing coil of FIG. 2;

FIG. 13 illustrates how the stimulative magnetic field changes with time in a certain place within the CMGC;

FIG. 14 shows time differential of FIG. 13; and

FIG. 15 shows how the canceling magnetic field by the CMGC changes with time.

DETAILED DESCRIPTION OF THE INVENTION

Figure 2:
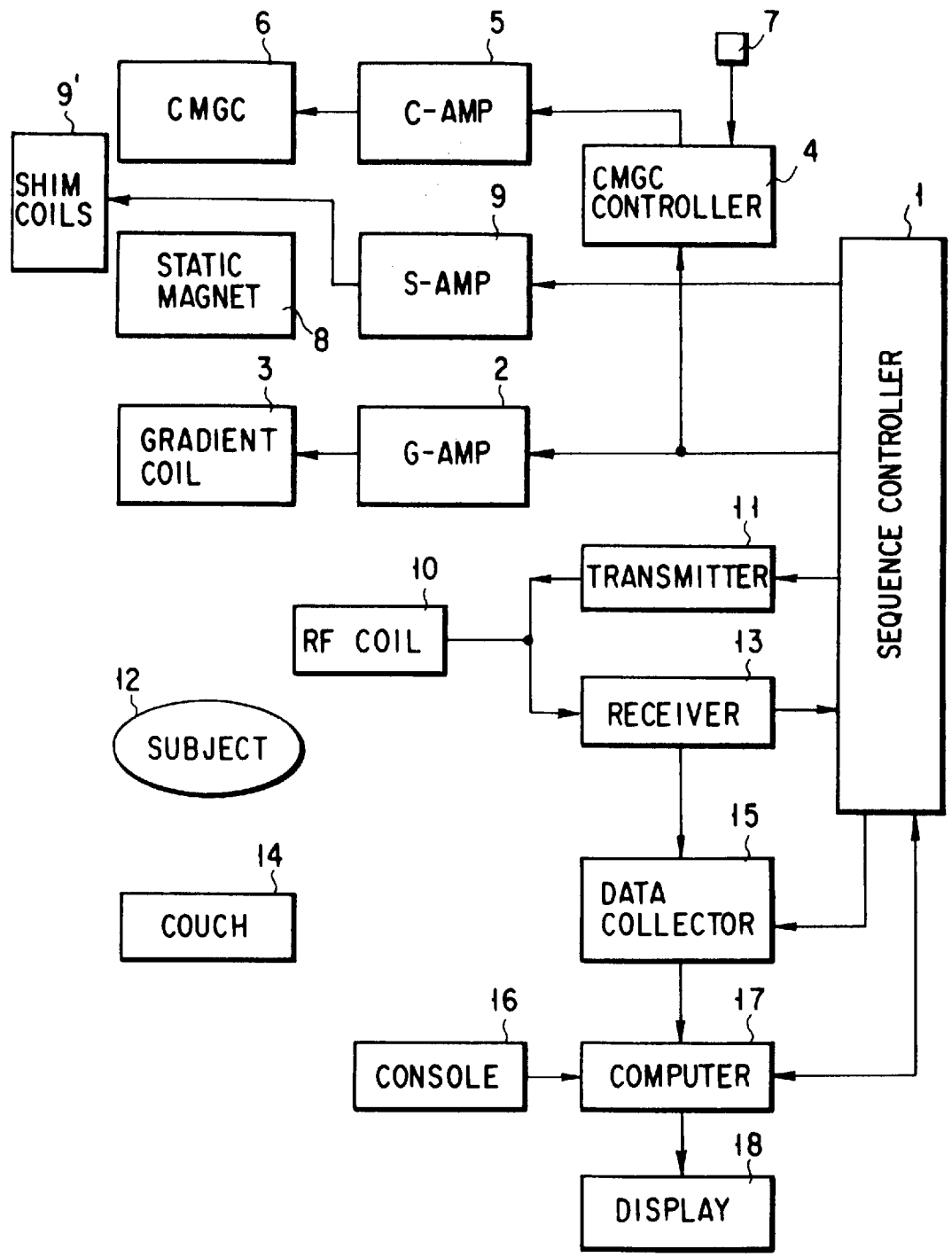
FIG. 2 is a block diagram of a magnetic resonance diagnostic apparatus according to an embodiment of the present invention.

FIG. 2 is a block diagram of the configuration of a magnetic resonance diagnostic apparatus according to an embodiment of the present invention. A static field magnet 8, shim coils 9', a gradient coil 3, and an RF coil 10 are assembled on a structure called a gantry. Almost in the center of the gantry, a cylindrical space (hereinafter, referred to as an imaging space) is formed. During image, a subject 12 laid on a couch 14 is inserted into the imaging space.

The shim coils 9' provided in order to supply a uniform static magnetic field to a subject from the static field magnet 8 is designed to adjust uniformly static magnetic field in the imaging space, when an amplifier (S-AMP) 9 supplies current to the shim coils 9'. For the sake of explanation, the origin is set in the center of the imaging space and three orthogonal axes (X, Y, and Z) are determined. The Z-axis is assumed to be parallel with the direction of the static magnetic field.

The gradient coil 3 has an X coil, a Y coil, and a Z coil. An amplifier (G-AMP) 2 supplies a current separately to each of the X coil, Y coil, and Z coil, which then form in the imaging space a gradient magnetic field whose intensity changes according to the positions of the respective axes.

The RF coil 10 receives a high-frequency signal from a transmitter 11 and generates a high-frequency magnetic field in the imaging space. A receiver 13 receives the MR signal from the subject 12 via the RF coil 10. A data collector 15 collects the received MR signal.

A computer 17 not only controls the entire system but also reconstructs medical information useful for diagnosis, such as MR images, by 2 DFT (two-dimensional Fourier transformation) on the basis of the collected MR signal.

A console 16 is provided for the operator to enter imaging conditions and commands into the computer 17.

A display 18 is provided to display the reconstructed medical information, such as MR images.

A sequence controller 1 controls the transmitter 11, receiver 13, and G-AMP 2 according to the pulse sequence in, for example, the echo planer imaging scheme (EPI). As a result of this control, a high-frequency magnetic field and a gradient magnetic field are generated sequentially and a MR signal is generated from the subject 12.

The sequence controller 1 supplies a waveform signal (a first waveform signal) to the G-AMP 2. The G-AMP 2 amplifies the first waveform signal and supplies a current waveform similar to the first waveform signal to the gradient coil 3. This causes the gradient coil 3 to generate a gradient magnetic field having a temporal waveform similar to the first waveform signal.

The magnetic resonance diagnostic apparatus is characterized by having a component for alleviating a magnetic stimulus that the subject suffers from a stimulative magnetic field. The component comprises an CMGC controller 4, an amplifier (C-AMP) 5, a canceling magnetic field generating coil (CMGC) 6, and a sensing coil 7.

The CMGC 6 is removable and has only to be used when the subject 12 feels a strong magnetic stimulus. When being used, the CMGC 6 is disposed outside the imaging space and close to the portion at which the subject 1 feels a strong magnetic stimulus, for example, by the side of the waist of the subject.

The CMGC controller 4 takes in the waveform signal (the first waveform signal) outputted from the sequence controller 1 to the G-AMP 2 and forms a waveform signal (a second waveform signal) on the basis of the first waveform signal and the sense signal from the sensing coil 7. The C-AMP 5 amplifies the second waveform signal formed at the CMGC controller 4 and supplies a current having a waveform similar to that of the second waveform signal. This causes the CMGC 6 to generate a magnetic field (a canceling magnetic field) which has a waveform similar to that of the second waveform and which opposes the stimulative magnetic field (including a cross gradient magnetic field) that stimulates the subject 12.

The canceling magnetic field rises and falls in synchronization with the gradient magnetic field. The canceling magnetic field is generated so as to have the reversed polarity to that of the stimulative magnetic field. Consequently, the intensity of the resultant magnetic field of the stimulative magnetic field and canceling magnetic field is lower than that of the stimulative magnetic field, resulting in the alleviation of the stimulative magnetic field.

The sensing coil 7 is arranged in the CMGC 6 to sense the change of the resultant magnetic field with time. The sensing coil 7 is still useful for the correction the magnetic intensity which is changed according to the position of the CMGC 6.

Figure 1:
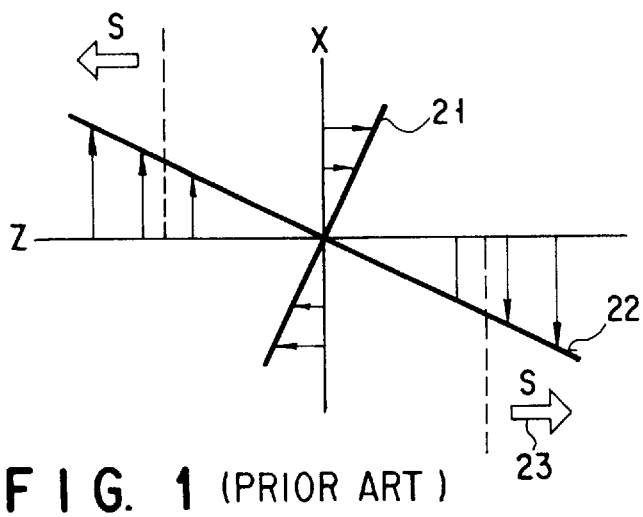
FIG. 1 illustrates an example of a stimulative magnetic field that stimulates the subject.
Figure 3:
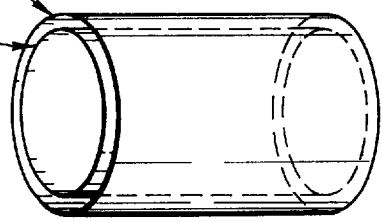
FIGS. 3 to 5 illustrate examples of the coil pattern of the canceling magnetic field generating coil (CMGC) of FIG. 2.
Figure 4:
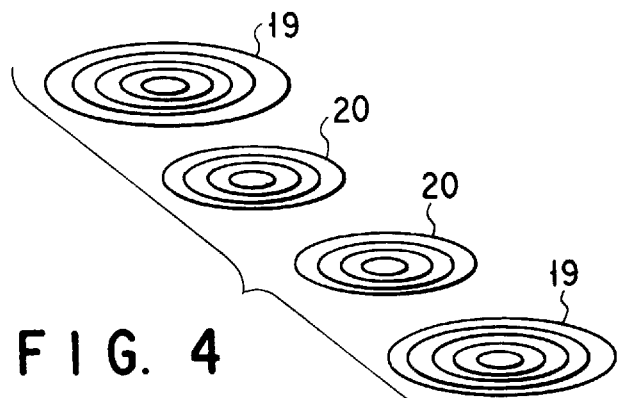
Figure 5:
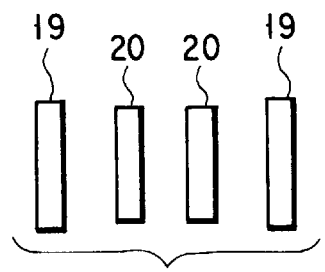

As shown in FIGS. 3 to 5, the CMGC 6 has a main coil 20 and a shielding coil 19. The purpose of this is to prevent the magnetic field from leaking out of the CMGC 6 and distorting the magnetic field in the imaging space. The main coil 20 may be connected in series with the shielding coil 19 or may be electrically separated from the shielding coil 19. The main coil 20 and shielding coil 19 may be of the distribution type in which a coil material is spirally wound (also known as the finger printed type), the band type, the saddle type, or the solenoid type. Where the subject 12 feels a strong stimulus is a portion sufficiently separate from the center of the imaging space. Therefore, it can be assumed that the gradient of the stimulative magnetic field in the portion is small and the magnetic field is almost uniform. As a result, the CMGC 6 may use a Maxwell-type coil that generates a uniform magnetic field effectively as shown in FIG. 4.

Figure 6:
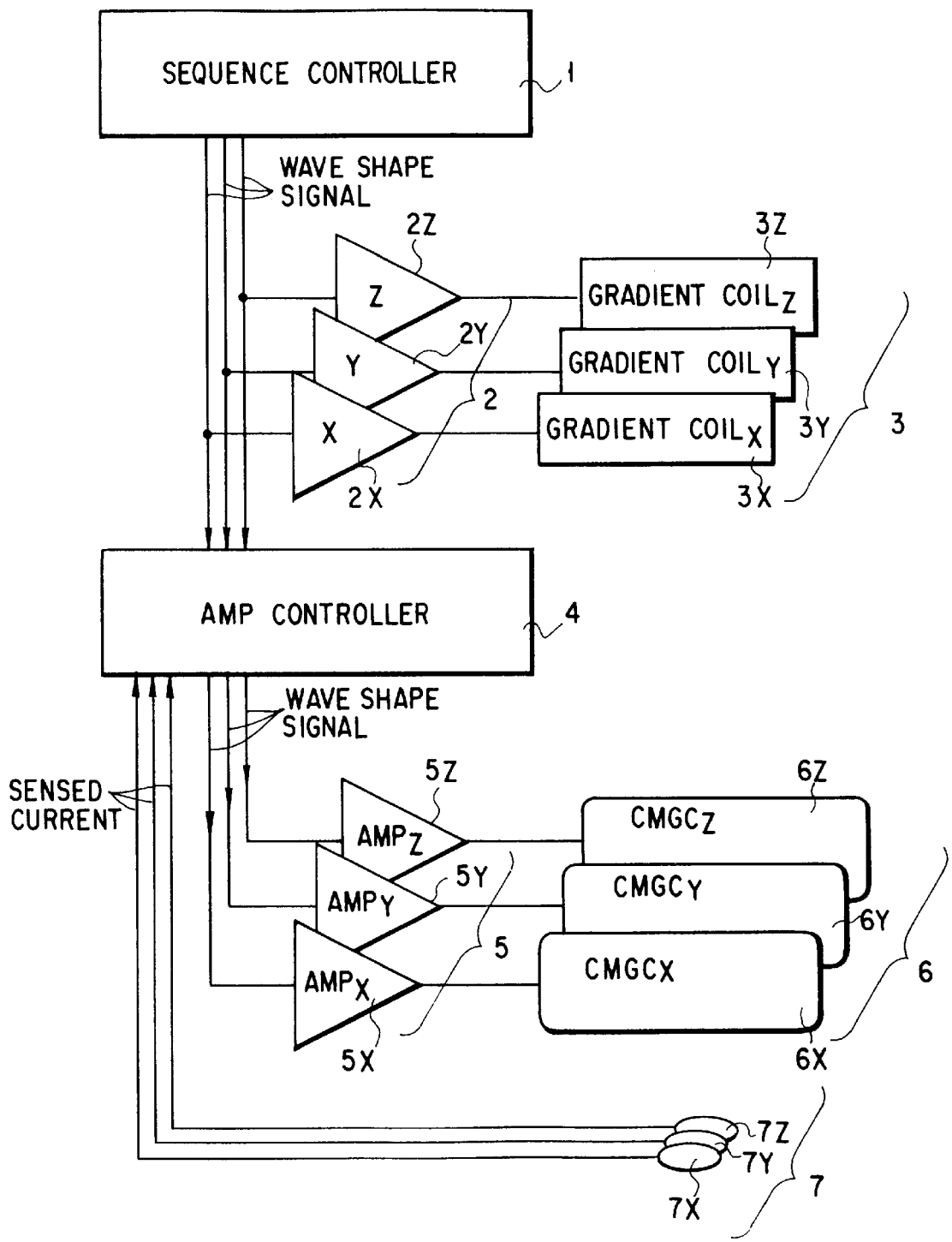
FIG. 6 shows the configuration of the canceling magnetic field generating system of FIG. 2.

As shown in FIG. 6, the CMGC 6 has three coils $6x$, $6y$, and $6z$ corresponding to the X, Y, and Z axes, respectively. The three coils $6x$, $6y$, and $6z$ are arranged so that the directions of the magnetic fields generated in the respective coils may cross each other at right angles. This makes it possible to generate canceling magnetic fields in the three directions and cancel out the components in the three directions of the stimulative magnetic field.

Three units of the C-AMP 5 are provided ($5x$, $5y$, $5z$). Similarly, three units of the sensing coil 7 are provided ($7x$, $7y$, $7z$). The sensing coil $7x$ senses the change with time of the X-axis component of the resultant magnetic field, the sensing coil $7y$ senses the change with time of the Y-axis component of the resultant magnetic field, and the sensing coil 7z senses the change with time of the Z-axis component of the resultant magnetic field. As shown in FIGS. 10 to 12, the x coil 7x, y coil 7y, and z coil 7z of the sensing coil 7 may be of any type.

Figure 7:
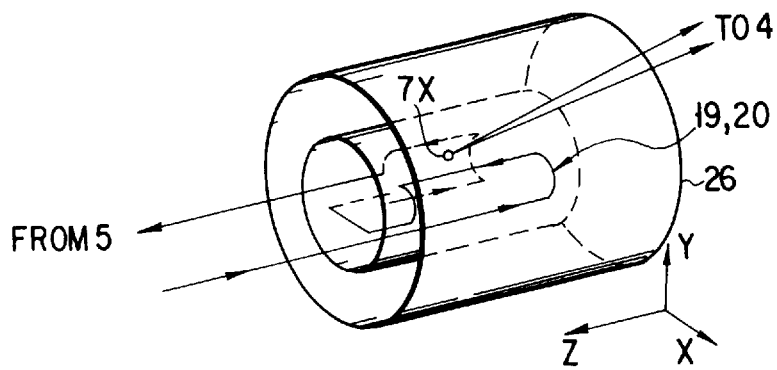
FIGS. 7 to 9 illustrate retainers for the canceling magnetic field generating coil (CMGC) of FIG. 2.
Figure 8:
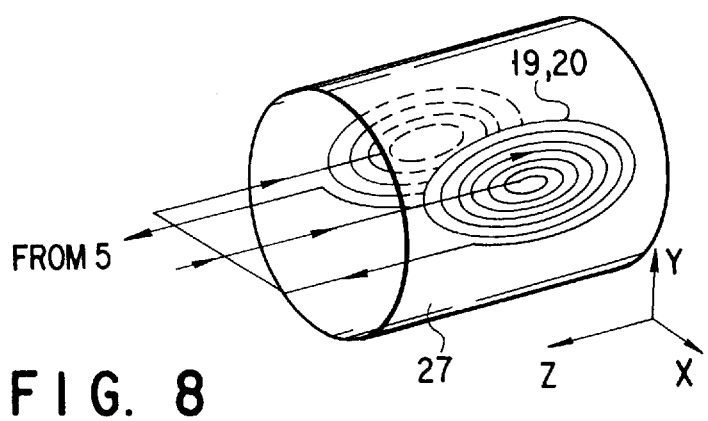
Figure 9:
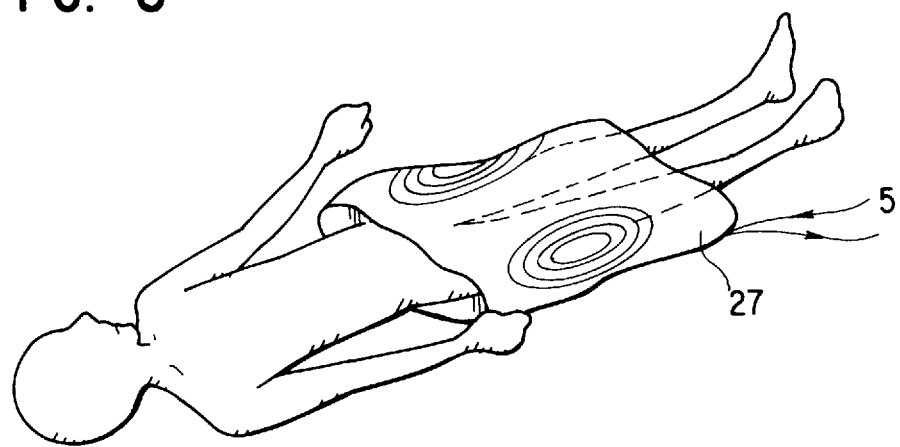

The CMGC 6 is embedded in a hard plastic cylinder (or a FRP bobbin) 26 as shown in FIG. 7 or in a relatively flexible cylinder 27 as shown in FIG. 8. For use, the resulting cylinder 26 or 27 is set at the waist of the subject as shown in FIG. 9.

Next, the operation of the embodiment will be described, taking the EPI as a example, The sequence controller 1 supplies the first waveform signal to the G-AMP 2. The first waveform signal is amplified at the G-AMP 2. The current amplified by the G-AMP is supplied to the gradient coil 3. The gradient coil 3 then generates in the imaging space a gradient magnetic field whose temporal waveform is similar to the first waveform signal.

As a result of the generation of the gradient magnetic field, a stimulative magnetic field is generated. The main component of the stimulative magnetic field is a cross gradient magnetic field. When an X-axis gradient magnetic field is generated, a stimulative magnetic field is generated in the direction of the X-axis. When an Y-axis gradient magnetic field is generated, a stimulative magnetic field is generated in the direction of the Y-axis.

FIG. 13 shows the change of the stimulative magnetic field with time in a certain place within the CMGC 6. With the EPI, gradient magnetic fields alternate with each other. Stimulative magnetic fields also alternate with each other in synchronization with the alternation of the gradient magnetic fields.

FIG. 14 shows the result (dB/dt) of differentiating B(t) with respect with time. The stimulative magnetic field changes with time in the period during which the magnetic field rises and falls. In the period during which the stimulative magnetic field changes with time, an eddy current is induced in the subject 12, who therefore feels a magnetic stimulus.

To alleviate such a stimulus, a canceling magnetic field that opposes the stimulative magnetic field is generated. The temporal waveform of the canceling magnetic field can be controlled by changing the shape of a second waveform signal formed by the CMGC controller 4.

The second waveform signal is initially formed according to the first waveform signal from the sequence controller 1. The second waveform signal causes a canceling magnetic field (Bop(t)) to be generated so that the canceling magnetic field may have the reversed polarity to that of the stimulative magnetic field and rise to the initial intensity ($\Delta d2$) in synchronization with the stimulative magnetic field and fall to an intensity of zero in synchronization with the stimulative magnetic field.

When the first waveform signal correspond to the X-axis gradient magnetic field, the second waveform signal is outputted to the C-AMP 5x and a canceling magnetic field is generated in the X-axis direction. When the first waveform signal corresponds to the Y-axis gradient magnetic field, the second waveform signal is outputted to the C-AMP 5y corresponding to the Y-axis and a canceling magnetic field is generated in the Y-axis direction.

When the sensing coil 7 has sensed the X-axis component and Y-axis component of the stimulative magnetic field, the second waveform signal corresponding to the intensity of each component is supplied to each of the C-AMP 5x and C-AMP 5y. As a result of this, an X-axis canceling magnetic field and a Y-axis canceling magnetic field are generated and therefore the X-axis component and Y-axis component of the stimulative magnetic field become smaller in appearance.

It is in the rising period and falling period during which the magnetic field changes with time that the subject 12 feels a stimulus. Since in the rising period and falling period, the resultant magnetic field of the stimulative magnetic field and canceling magnetic field has a lower intensity in absolute value than that of the stimulative magnetic field, a current induced in the subject 12 is smaller than when there is no canceling magnetic field. As a result, the stimulative magnetic field becomes weaker. By adjusting the initial intensity ($\Delta d2$) of the canceling magnetic field, the stimulative magnetic field can be made still weaker.

The adjustment is made by the CMGC controller 4 on the basis of the sense signal from the sensing coil 7. When the initial intensity ($\Delta d2$) of the canceling magnetic field is not equal to the intensity ($\Delta d1$) of the stimulative magnetic field, the intensity of the resultant magnetic field is not zero. As a result, a current is induced in the sensing coil 7. The current (sense signal) is taken in by the CMGC controller 4. The crest value of the second waveform signal is changed so that the sense signal from the CMGC controller 4 may be zero or almost zero. With this change, $\Delta d2$ of the canceling magnetic field becomes larger or smaller and therefore the resultant magnetic field becomes zero or almost zero. This eliminates or weakens the stimulative magnetic field.

It is not necessary to cancel the stimulative magnetic field completely. The stimulative magnetic field has only to be weakened below the threshold at which the subject 12 feels a stimulus. Specifically, the stimulative magnetic field may be below 4 A/m$^2$ in the current value induced in the subject or below 60 T/S in dB/dt representation.

The magnetic stimulus described above takes place in the period during which the stimulative magnetic field is changing. Therefore, it may be good to generate the canceling magnetic field only in the changing period of the stimulative magnetic field, that is, the rising period and falling period. In the present embodiment, however, the generation of the canceling magnetic field is continued with the risen intensity even in the flat period during which the stimulative magnetic field remains unchanged as seen from FIGS. 13 to 15. The reason for this is as follows.

If the canceling magnetic field is stopped at the time when the stimulative magnetic field has risen, the canceling magnetic field will rise with an inherent time constant. If a canceling magnetic field is generated immediately before a stimulative magnetic field rises, the canceling magnetic field will rise with an inherent time constant. In the period during which the canceling magnetic field rises or falls independently and out of synchronization with such a stimulative magnetic field, the magnetic field intensity of the stimulative magnetic field does not change with time. Therefore, in these periods, the resultant magnetic field changes, so that the subject 12 suffers a stimulus. To avoid this, in the period during which the stimulative magnetic field is flat, the flat canceling magnetic field is generated continuously without interruption.

The present invention is not restricted to the above embodiment, but may be practiced or embodied in still other ways without departing from the spirit or essential character thereof. Up to now, the case where a stimulative magnetic field is generated by a cross gradient magnetic field has been explained. As the intensity of the gradient magnetic field gets higher, the gradient magnetic field itself generates a magnetic stimulus. In this case, too, the present invention can prevent a magnetic stimulus with a similar configuration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A magnetic resonance diagnostic apparatus comprising:
a generator for sequentially generating a high-frequency magnetic field and a gradient magnetic field to generate a magnetic resonance signal from a subject in an imaging space;
a processor for acquiring medical information about said subject on the basis of said magnetic resonance signal; and
a canceling magnetic field generator configured to produce a canceling magnetic field in a space outside said imaging space, said canceling magnetic field being generated to oppose a stimulative magnetic field arising because of said gradient magnetic field in said space outside said imaging space, said stimulative magnetic field stimulating part of said subject, wherein said stimulative magnetic field is generated in synchronization with said gradient magnetic field, said canceling magnetic field has a polarity reversed relative to a polarity of said stimulative magnetic field, and a resultant magnetic field of said stimulative magnetic field and said canceling magnetic field has a lower intensity than that of said stimulative magnetic field.

2. The magnetic resonance diagnostic apparatus according to claim 1, wherein said canceling magnetic field generator includes a controller for causing said canceling magnetic field to rise and fall in synchronization with said gradient magnetic field.

3. The magnetic resonance diagnostic apparatus according to claim 1, wherein said canceling magnetic field generator includes a controller for causing the rise time and fall time of said canceling magnetic field to coincide with the rise time and fall time of said gradient magnetic field, respectively.

4. The magnetic resonance diagnostic apparatus according to claim 1, wherein said canceling magnetic field generator includes a controller for keeping said canceling magnetic field flat in the period during which said gradient magnetic field is kept flat.

5. The magnetic resonance diagnostic apparatus according to claim 1, further comprising a sensing coil that senses the intensity of said resultant magnetic field.

6. The magnetic resonance diagnostic apparatus according to claim 5, wherein said canceling magnetic field generator includes a controller for changing the intensity of said canceling magnetic field according to the sense signal from said sensing coil so that the intensity of said resultant magnetic field may approach zero.

7. The magnetic resonance diagnostic apparatus according to claim 5, wherein said sensing coil has at least two coils that sense magnetic fields whose directions differ from each other.

8. The magnetic resonance diagnostic apparatus according to claim 1, wherein said canceling magnetic field generator has at least two coils which generate said canceling magnetic field and which generate magnetic fields whose directions differ from each other.

9. The magnetic resonance diagnostic apparatus according to claim 1, wherein said canceling magnetic field generator has main coils and shield coils for generating said canceling magnetic field.

10. The magnetic resonance diagnostic apparatus according to claim 1, wherein said canceling magnetic field generator has a coil which generates said canceling magnetic field and which is supported by a flexible cylindrical member.

11. A canceling magnetic field generating apparatus comprising:
a coil disposed by a side of any portion of a subject; and
an amplifier for supplying a current to said coil to generate a canceling magnetic field that opposes a stimulative magnetic field arising from a field source, said stimulative magnetic field stimulating said portion, wherein said canceling magnetic field has a polarity reversed relative to a polarity of said stimulative magnetic field and a resultant magnetic field of said stimulative magnetic field and said canceling magnetic field has a lower intensity than an intensity of said stimulative magnetic field.

12. The canceling magnetic field generating apparatus according to claim 11, wherein said amplifier has a controller for changing said canceling magnetic field in synchronization with the change of said stimulative magnetic field.

13. The canceling magnetic field generating apparatus according to claim 11, wherein said amplifier has a controller for keeping said canceling magnetic field flat in the period during which said stimulative magnetic field is kept flat.

14. The canceling magnetic field generating apparatus according to claim 11, further comprising a sensing coil that senses the intensity of said resultant magnetic field.

15. The canceling magnetic field generating apparatus according to claim 14, wherein said amplifier includes a controller for changing the intensity of said canceling magnetic field according to the sense signal from said sensing coil so that the intensity of said resultant magnetic field may approach zero.

16. The canceling magnetic field generating apparatus according to claim 14, wherein said sensing coil has at least two coils that sense magnetic fields whose directions differ from each other.

17. The canceling magnetic field generating apparatus according to claim 11, wherein said coil has at least two coils which generate magnetic fields whose directions differ from each other.

18. The canceling magnetic field generating apparatus according to claim 11, wherein said coil has main coils and shield coils for generating said canceling magnetic field.

19. The canceling magnetic field generating apparatus according to claim 11, wherein said coil is supported by a flexible cylindrical member.

* * * * *